(12) United States Patent
Eom et al.

(10) Patent No.: US 11,183,091 B2
(45) Date of Patent: Nov. 23, 2021

(54) DISPLAY APPARATUS AND METHOD OF DETECTING DEFECT OF THE SAME

(71) Applicant: Samsung Display Co., Ltd., Yongin-si (KR)

(72) Inventors: Cheol Hwan Eom, Asan-si (KR); Hyung Jun An, Cheonan-si (KR); Hyea Weon Shin, Seongnam-si (KR); Jeong Oh Jin, Hwaseong-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 17/070,492

(22) Filed: Oct. 14, 2020

(65) Prior Publication Data

US 2021/0158733 A1   May 27, 2021

(30) Foreign Application Priority Data

Nov. 27, 2019   (KR) .......................... 10-2019-0154788

(51) Int. Cl.
  *G09G 3/00* (2006.01)
  *G09G 3/3266* (2016.01)
  *G09G 3/3275* (2016.01)
  *H01L 51/52* (2006.01)
  *G09G 3/20* (2006.01)
  *H01L 27/32* (2006.01)

(52) U.S. Cl.
  CPC ........... *G09G 3/006* (2013.01); *G09G 3/2003* (2013.01); *G09G 3/3266* (2013.01); *G09G 3/3275* (2013.01); *G09G 2310/08* (2013.01); *G09G 2330/028* (2013.01); *H01L 27/3276* (2013.01); *H01L 51/5221* (2013.01)

(58) Field of Classification Search
  CPC .... G09G 3/006; G09G 3/3208; G09G 3/3258; G09G 3/3233; H01L 27/124; H01L 27/1244; H01L 27/3276
  See application file for complete search history.

(56) References Cited

U.S. PATENT DOCUMENTS 9,449,552 B2 * 9/2016 Lee .................. G09G 3/3233

FOREIGN PATENT DOCUMENTS

| KR | 10-0586847 B1 | 6/2006 |
| KR | 10-0788823 B1 | 12/2007 |
| KR | 10-1364410 B1 | 2/2014 |
| KR | 10-1639083 B1 | 7/2016 |
| KR | 10-2017-0064170 A | 6/2017 |
| KR | 10-1983146 B1 | 5/2019 |

\* cited by examiner

*Primary Examiner* — Sardis F Azongha
(74) *Attorney, Agent, or Firm* — Lewis Roca Rothgerber Christie LLP

(57) ABSTRACT

A display apparatus includes a display panel, an electrode, a first wiring, a second wiring, a first contact hole, a second contact hole and a first resistor. The display panel includes an active area to display an image and a peripheral area adjacent to the active area. The electrode is in the active area. The first wiring is in the peripheral area and configured to apply a power voltage to the electrode. The second wiring is in the peripheral area and configured to apply the power voltage to the electrode. The first contact hole connects the electrode and the first wiring. The second contact hole connects the electrode and the second wiring. The first resistor is connected between the first wiring and the second wiring.

20 Claims, 10 Drawing Sheets

FIG. 7

| Distinction Table | | Left Damage | | Right Damage | |
|---|---|---|---|---|---|
| | | ADCX | ADCY | ADCX | ADCY |
| Contact Damage | SWY Off | $-\triangle Vdrop$ | 0 | $+\triangle Vdrop$ | 0 |
| | SWY On | $-\triangle Vdrop \times 1/2$ | $-\triangle Vdrop \times 1/2$ | $+\triangle Vdrop \times 1/2$ | $+\triangle Vdrop \times 1/2$ |
| Bending Damage | SWY Off | $+\triangle Vdrop$ | 0 | $-\triangle Vdrop$ | 0 |
| | SWY On | $+\triangle Vdrop$ | $-\triangle Vdrop$ | $-\triangle Vdrop$ | $+\triangle Vdrop$ |

DISPLAY APPARATUS AND METHOD OF DETECTING DEFECT OF THE SAME

CROSS-REFERENCE TO RELATED APPLICATION

This application claims priority to and the benefit of Korean Patent Application No. 10-2019-0154788, filed on Nov. 27, 2019 in the Korean Intellectual Property Office (KIPO), the entire content of which is incorporated herein by reference.

BACKGROUND

1. Field

One or more example embodiments of the present disclosure relate to a display apparatus and a method of detecting a defect of the display apparatus.

2. Description of the Related Art

A display apparatus includes a display panel and a display panel driver. The display panel driver includes a gate driver, a data driver, an emission driver, a driving controller and a power voltage generator.

The display apparatus may include wirings to output a power voltage and a driving signal to the display panel. The wirings may be disposed between the display panel driver and the display panel. In addition, the display apparatus may further include a contact hole to connect an electrode of the display panel and the wirings.

Due to a crack of the contact hole or a crack of the wiring formed during a manufacturing step of the display apparatus or during operation of the display apparatus, a defect in the contact hole and/or a defect in the wiring may be present. The crack in the contact hole or the crack in the wiring may cause electric fields to be generated between wirings such that a sensor in the display apparatus may malfunction.

SUMMARY

One or more aspects of example embodiments of the present disclosure are directed toward a display apparatus capable of correctly determining a position of a defect of the display apparatus.

One or more aspects of example embodiments of the present disclosure are directed toward a method of detecting a defect of the display apparatus.

One or more aspects of example embodiments of the present disclosure are directed toward detecting a defect using a resistor connected between a first wiring and a second wiring which apply power voltages to a display panel and a method of detecting a defect of the display apparatus In an example embodiment of a display apparatus according to the present disclosure, the display apparatus includes a display panel, an electrode, a first wiring, a second wiring, a first contact hole, a second contact hole and a first resistor. The display panel includes an active area to display an image and a peripheral area adjacent to the active area. The electrode is in the active area. The first wiring is in the peripheral area and configured to apply a power voltage to the electrode. The second wiring is in the peripheral area and configured to apply the power voltage to the electrode. The first contact hole connects the electrode and the first wiring. The second contact hole connects the electrode and the second wiring. The first resistor is connected between the first wiring and the second wiring.

In an example embodiment, the display apparatus may further include a second resistor and a first switch connected between the first wiring and the second wiring.

In an example embodiment, the display apparatus may further include a driving controller configured to measure a first voltage at both ends of the first resistor and a second voltage at both ends of the second resistor in response to a turned-off state of the first switch, and to measure the first voltage and the second voltage in response to a turned-on state of the first switch.

In an example embodiment, wherein the driving controller is configured to detect a defect of the first contact hole or the second contact hole based on an absolute value of the first voltage being ΔVdrop and an absolute value of the second voltage being zero in response to the turned-off state of the first switch, and based on the absolute value of the first voltage being ΔVdrop/2 and the absolute value of the second voltage being ΔVdrop/2 in response to the turned-on state of the first switch.

In an example embodiment, wherein the driving controller is configured to detect a defect of the first wiring or the second wiring based on the absolute value of the first voltage being ΔVdrop and the absolute value of the second voltage being zero in response to the turned-off state of the first switch, and based on the absolute value of the first voltage being ΔVdrop and the absolute value of the second voltage being ΔVdrop in response to the turned-on state of the first switch.

In an example embodiment, the display apparatus may further include a third resistor and a second switch connected between the first wiring and the second wiring.

In an example embodiment, a driving controller may be configured to measure a first voltage at both ends of the first resistor, a second voltage at both ends of the second resistor, and a third voltage at both ends of the third resistor in response to a turned-off state of the first switch and a turned-off state of the second switch, and to measure the first voltage, the second voltage, and the third voltage in response to a turned-on state of at least one of the first switch or the second switch.

In an example embodiment, the display apparatus may further include a third contact hole connected to the electrode, a fourth contact hole connected to the electrode, a third wiring connecting the first contact hole and the third contact hole and a fourth wiring connecting the second contact hole and the fourth contact hole.

In an example embodiment, the first contact hole and the second contact hole may be connected to a first end portion of the electrode. The third contact hole and the fourth contact hole may be connected to a second end portion of the electrode opposite to the first end portion of the electrode.

In an example embodiment, the first resistor, the second resistor and the first switch may be in the peripheral area of the display panel.

In an example embodiment, the display apparatus may further include a printed circuit board connected to the peripheral area of the display panel. The first resistor, the second resistor and the first switch may be on the printed circuit board.

In an example embodiment, the display panel may include a plurality of pixels. The pixels may include organic light emitting elements. The electrode may be a cathode electrode of the organic light emitting elements.

In an example embodiment, a first power voltage and a second power voltage less than the first power voltage may be applied to a pixel of the plurality of pixels. The second power voltage may be applied to the first wiring and the second wiring.

In an example embodiment of a method of detecting a defect of a display apparatus according to the present disclosure, the method includes applying a power voltage to a first wiring, a first contact hole connected to the first wiring and an electrode connected to the first contact hole, applying the power voltage to a second wiring, a second contact hole connected to the second wiring and the electrode connected to the second contact hole and measuring a first voltage at both ends of a first resistor connected between the first wiring and the second wiring. The electrode is in an active area. The first wiring and the second wiring may be in a peripheral area adjacent to the active area.

In an example embodiment, the method may further include controlling a first switch connected between the first wiring and the second wiring and measuring a second voltage at both ends of a second resistor connected between the first wiring and the second wiring and connected to the first switch.

In an example embodiment, the measuring the second voltage may include measuring the first voltage and the second voltage in response to a turned-off state of the first switch and measuring the first voltage and the second voltage in response to a turned-on state of the first switch.

In an example embodiment, the method may further include detecting a defect of the first contact hole or the second contact hole when an absolute value of the first voltage is ΔVdrop and an absolute value of the second voltage is zero in response to the turned-off state of the first switch, and the absolute value of the first voltage is ΔVdrop/2 and the absolute value of the second voltage is ΔVdrop/2 in response to the turned-on state of the first switch.

In an example embodiment, the method may further include detecting a defect of the first wiring or the second wiring when the absolute value of the first voltage is ΔVdrop and the absolute value of the second voltage is zero in response to the turned-off state of the first switch, and the absolute value of the first voltage is ΔVdrop and the absolute value of the second voltage is ΔVdrop in response to the turned-on state of the first switch.

In an example embodiment, the method may further include controlling a second switch connected between the first wiring and the second wiring and measuring a third voltage at both ends of a third resistor connected between the first wiring and the second wiring and connected to the second switch.

In an example embodiment, the measuring the third voltage may include measuring the first voltage, the second voltage and the third voltage in response to a turned-off state of the first switch and a turned-off state of the second switch and measuring the first voltage, the second voltage and the third voltage in response to a turned-on state of at least one of the first switch or the second switch.

According to the display apparatus and the method of detecting the defect of the display apparatus, the defect of the display apparatus may be detected using the resistor connected between the first wiring and the second wiring which apply the power voltages to the display panel. In addition, the position of the defect of the display apparatus may be determined (e.g., correctly determined) using the first resistor, the second resistor and the first switch connected between the first wiring and the second wiring. Thus, the reliability of the display apparatus may be enhanced.

BRIEF DESCRIPTION OF THE DRAWINGS

The above and other features and advantages of the present disclosure will become more apparent by describing example embodiments thereof in more detail with reference to the accompanying drawings, in which:

FIG. 7 is a table illustrating a method of detecting a defect of the display apparatus of FIG. 1;

DETAILED DESCRIPTION

Hereinafter, the present disclosure will be explained in more detail with reference to the accompanying drawings.

Figure 1:
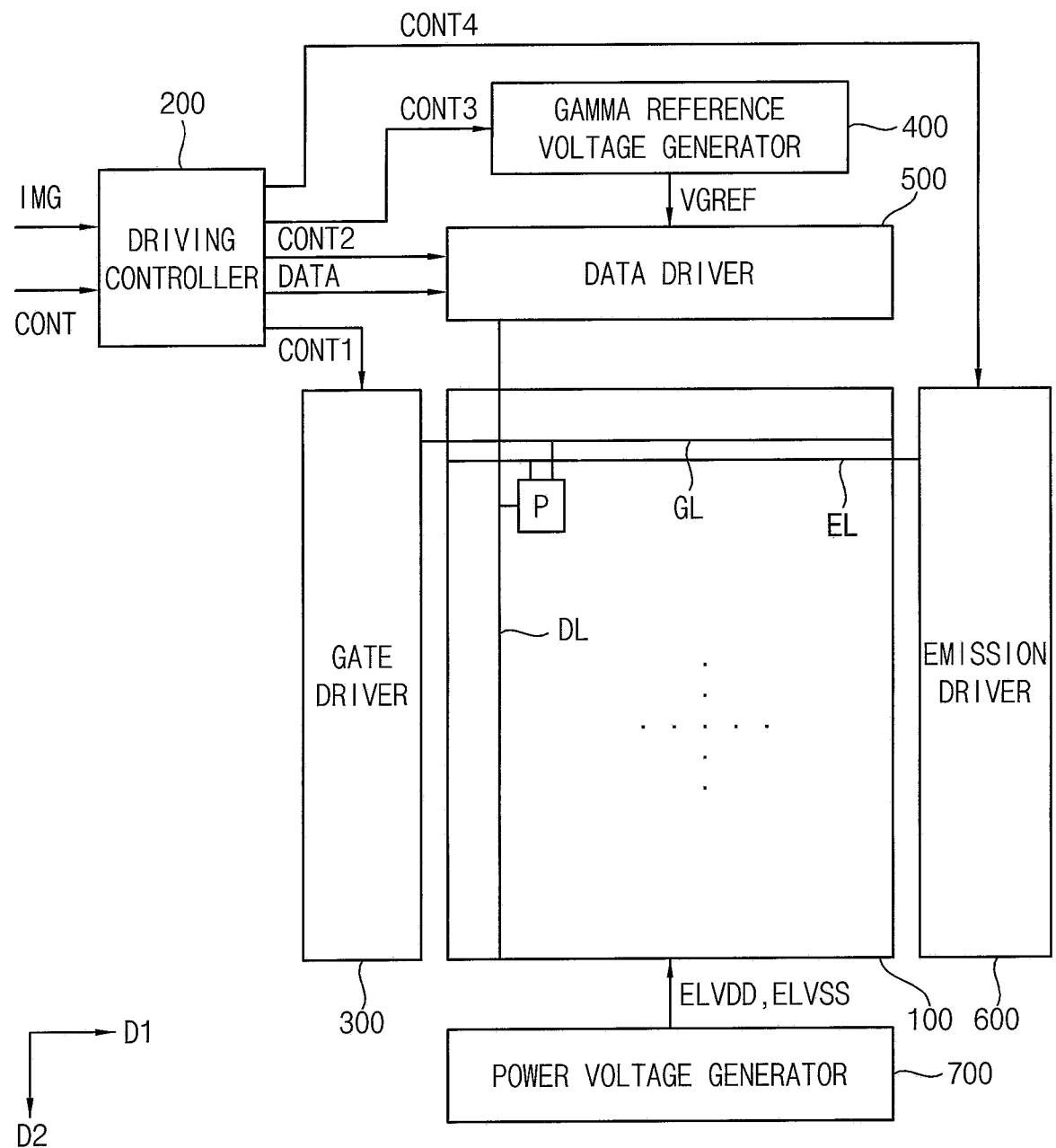
FIG. 1 is a block diagram illustrating a display apparatus according to an example embodiment of the present disclosure.

FIG. 1 is a block diagram illustrating a display apparatus according to an example embodiment of the present disclosure.

Referring to FIG. 1, the display apparatus includes a display panel 100 and a display panel driver. The display panel driver may include a driving controller 200, a gate driver 300, a gamma reference voltage generator 400, a data driver 500 and an emission driver 600. The display panel driver may further include a power voltage generator 700.

The display panel 100 includes a plurality of gate lines GL, a plurality of data lines DL, a plurality of emission lines EL and a plurality of pixels P electrically connected to the gate lines GL, the data lines DL and the emission lines EL. The gate lines GL and the emission lines EL may extend in a first direction D1, and the data lines DL may extend in a second direction D2 crossing the first direction D1. In one or more embodiments, the first direction D1 is perpendicular to or normal to the second direction D2 as shown in FIG. 1.

In one or more embodiments, the display panel 100 may be an organic light emitting panel including organic light emitting diodes.

The driving controller 200 receives input image data IMG and an input control signal CONT from an external apparatus. For example, the input image data IMG may include red image data, green image data and blue image data. In one or more embodiments, the input image data IMG may include white image data. The input image data IMG may include magenta image data, cyan image data and yellow image data. The input control signal CONT may include a master clock signal and a data enable signal. The input control signal CONT may further include a vertical synchronizing signal and a horizontal synchronizing signal.

The driving controller 200 generates a first control signal CONT1, a second control signal CONT2, a third control signal CONT3, a fourth control signal CONT4 and a data signal DATA based on the input image data IMG and the input control signal CONT.

The driving controller 200 generates the first control signal CONT1 for controlling an operation of the gate driver 300 based on the input control signal CONT, and outputs the first control signal CONT1 to the gate driver 300. The first control signal CONT1 may include a vertical start signal and a gate clock signal.

The driving controller 200 generates the second control signal CONT2 for controlling an operation of the data driver 500 based on the input control signal CONT, and outputs the second control signal CONT2 to the data driver 500. The second control signal CONT2 may include a horizontal start signal and a load signal.

The driving controller 200 generates the data signal DATA based on the input image data IMG. The driving controller 200 outputs the data signal DATA to the data driver 500.

The driving controller 200 generates the third control signal CONT3 for controlling an operation of the gamma reference voltage generator 400 based on the input control signal CONT, and outputs the third control signal CONT3 to the gamma reference voltage generator 400.

The driving controller 200 generates the fourth control signal CONT4 for controlling an operation of the emission driver 600 based on the input control signal CONT, and outputs the fourth control signal CONT4 to the emission driver 600.

The gate driver 300 generates gate signals for driving the gate lines GL in response to the first control signal CONT1 received from the driving controller 200. The gate driver 300 may sequentially output the gate signals to the gate lines GL. In one or more embodiments, the gate driver 300 may be integrated on or integral with the display panel 100. For example, the gate driver 300 may be mounted on the display panel 100.

The gamma reference voltage generator 400 generates a gamma reference voltage VGREF in response to the third control signal CONT3 received from the driving controller 200. The gamma reference voltage generator 400 provides or outputs the gamma reference voltage VGREF to the data driver 500. The gamma reference voltage VGREF has a value corresponding to a level of the data signal DATA.

In an example embodiment, the gamma reference voltage generator 400 may be disposed in the driving controller 200, or in the data driver 500.

The data driver 500 receives the second control signal CONT2 and the data signal DATA from the driving controller 200, and receives the gamma reference voltages VGREF from the gamma reference voltage generator 400. The data driver 500 converts the data signal DATA into data voltages having an analog type using the gamma reference voltages VGREF. The data driver 500 outputs the data voltages to the data lines DL.

Figure 2:
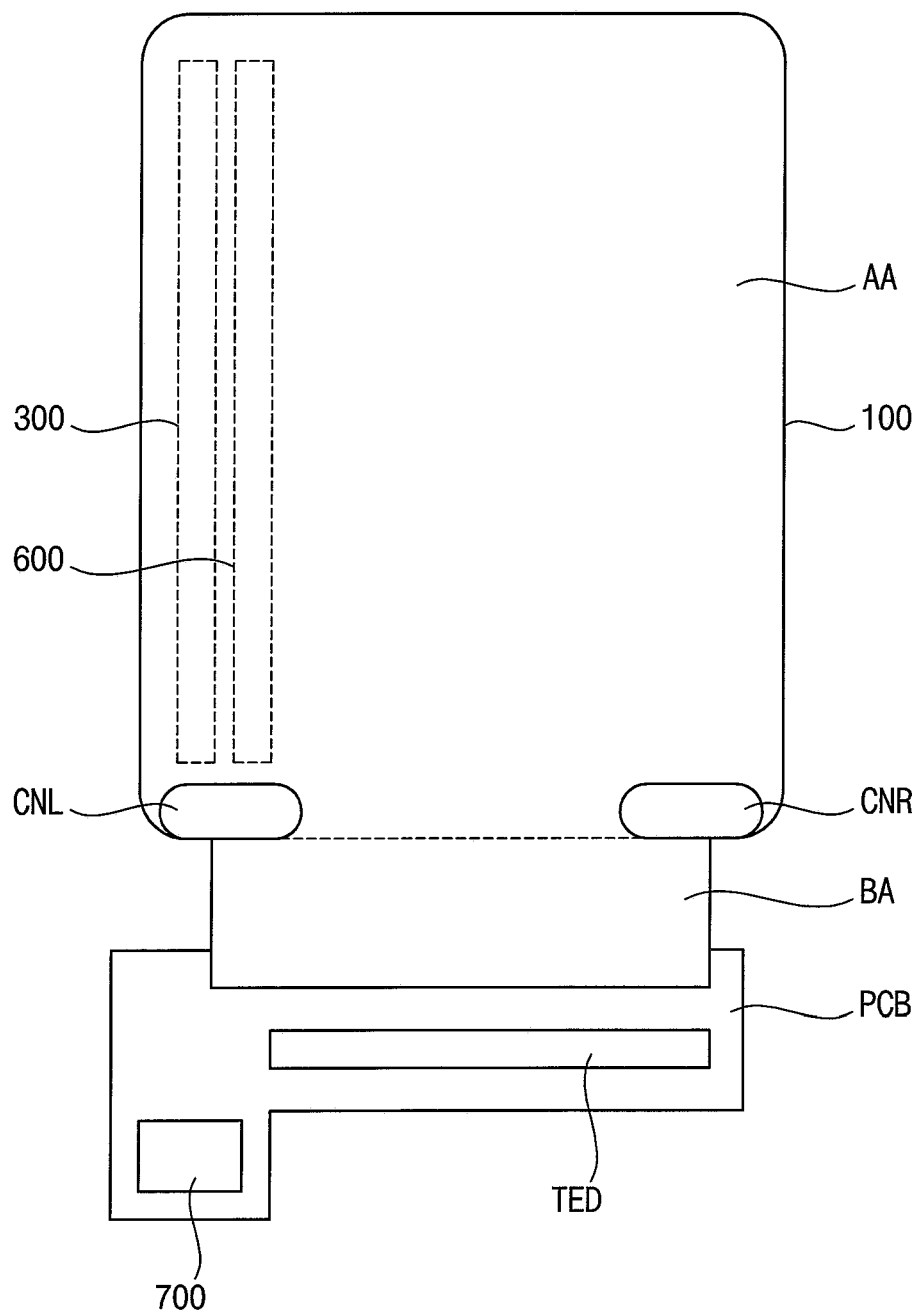
FIG. 2 is a conceptual diagram illustrating the display apparatus of FIG. 1.

For example, the data driver 500 may be integrally formed with the driving controller 200 to form a timing controller embedded data driver TED (e.g., as shown in the embodiment of FIG. 2). In other words, the timing controller embedded data driver TED may include the data driver 500 and the driving controller 200.

The emission driver 600 generates emission signals to drive the emission lines EL in response to the fourth control signal CONT4 received from the driving controller 200. The emission driver 600 may output the emission signals to the emission lines EL. In one or more embodiments, the emission driver 600 may be integrated on or integral with the display panel 100. For example, the emission driver 600 may be mounted on the display panel 100. In one or more embodiments, the emission driver 600 may be integrally formed (integral) with the gate driver 300.

The power voltage generator 700 may generate a first power voltage ELVDD and a second power voltage ELVSS. The second power voltage ELVSS may be less than the first power voltage ELVDD. The power voltage generator 700 may apply the first power voltage ELVDD and the second power voltage ELVSS to the display panel 100.

Figure 3:
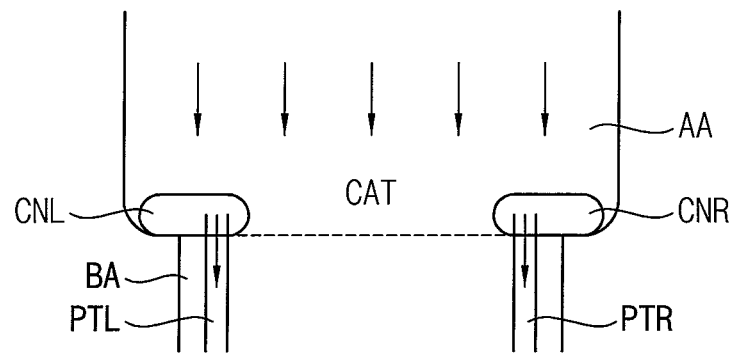
FIG. 3 is a conceptual diagram illustrating a portion of a display panel of FIG. 2.
Figure 4:
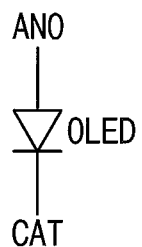
FIG. 4 is a circuit diagram illustrating an organic light emitting element of a pixel of the display apparatus of FIG. 1.

FIG. 2 is a conceptual diagram illustrating the display apparatus of FIG. 1. FIG. 3 is a conceptual diagram illustrating a portion of the display panel 100 of FIG. 2. FIG. 4 is a circuit diagram illustrating an organic light emitting element OLED of the pixel P of the display apparatus of FIG. 1.

Referring to FIGS. 1-4, the display panel 100 may include an active area AA where an image is displayed and a peripheral area BA adjacent to the active area AA. The peripheral area BA may be a bending area (e.g., an area capable of bending) which is bent toward a rear surface of the display panel 100.

The display apparatus may further include a printed circuit board PCB connected to the peripheral area BA. The driving controller 200, the gamma reference voltage generator 400, the data driver 500 and the power voltage generator 700 may be disposed on the printed circuit board PCB. The driving controller 200 and the data driver 500 may form the timing controller embedded data driver TED. For example, the timing controller embedded data driver TED may include the driving controller 200, the gamma reference voltage generator 400 and the data driver 500.

The gate driver 300 and the emission driver 600 may be integrated on or integral with the display panel 100.

The display panel 100 may include a plurality of pixels P. The pixels P may include organic light emitting elements OLED (e.g., as shown in the embodiment of FIG. 4). The organic light emitting elements OLED may include first electrodes ANO and second electrodes CAT. For example, an organic light emitting element OLED may include a first electrode ANO which may be an anode electrode and a second electrode CAT which may be a cathode electrode.

The second electrode CAT of the organic light emitting elements OLED may be integrally formed to cover an entire area of the active area AA.

The display apparatus may further include a first wiring PTL disposed in the peripheral area BA and applying a second power voltage ELVSS to the second electrode of the first wiring PTL, and a second wiring PTR disposed in the peripheral area BA and applying the second power voltage ELVSS to the second electrode of the second wiring PTR.

In one or more embodiments, the first wiring PTL may be disposed in a left end portion of the peripheral area BA. The second wiring PTR may be disposed in a right end portion of the peripheral area BA.

The display apparatus may further include a first contact hole CNL connecting the second electrode CAT and the first wiring PTL and a second contact hole CNR connecting the second electrode CAT and the second wiring PTR. In other words, the first contact hole CNL may be a hole filled with a conductive element that connects the second electrode (e.g., cathode electrode) CAT and the first wiring PTL, and the second contact hole CNR may be a hole filled with a conductive element that connects the second electrode CAT and the second wiring PTR.

In one or more embodiments, the first contact hole CNL may be disposed in a left lower portion of the active area AA. The second contact hole CNR may be disposed in a right lower portion of the active area AA.

FIG. 3 represents a path of the second power voltage ELVSS. The second power voltage ELVSS may be applied to the cathode electrode CAT through the first wiring PTL and the first contact hole CNL. The second power voltage ELVSS may be applied to the cathode electrode CAT through the second wiring PTR and the second contact hole CNR. A direction of a current may be from the display panel 100 to the power voltage generator 700 so that a direction of arrows in FIG. 3 is illustrated in a lower direction.

Figure 5:
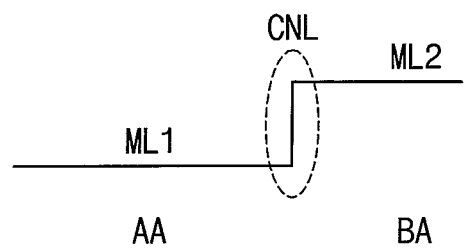
FIG. 5 is a conceptual diagram illustrating a path of a power voltage of the display panel of FIG. 2.

FIG. 5 is a conceptual diagram illustrating a path of a power voltage of the display panel of FIG. 2.

Referring to FIGS. 1-5, the second power voltage ELVSS may be applied to a first metal layer ML1 in the active area AA of the display panel 100. The second power voltage ELVSS may be applied to a second metal layer ML2 different from the first metal layer ML1 through the contact hole (e.g. CNL) in the peripheral area BA of the display panel 100. In one or more embodiments, the second metal layer ML2 is at a layer below the first metal layer ML1 (e.g., as shown in the embodiment of FIG. 2).

In one or more embodiments, the cathode area CAT may be formed from the first metal layer ML1 in the active area AA. In one or more embodiments, the first wiring PTL and the second wiring PTR may be formed from the second metal layer ML2 in the peripheral area BA.

Figure 6:
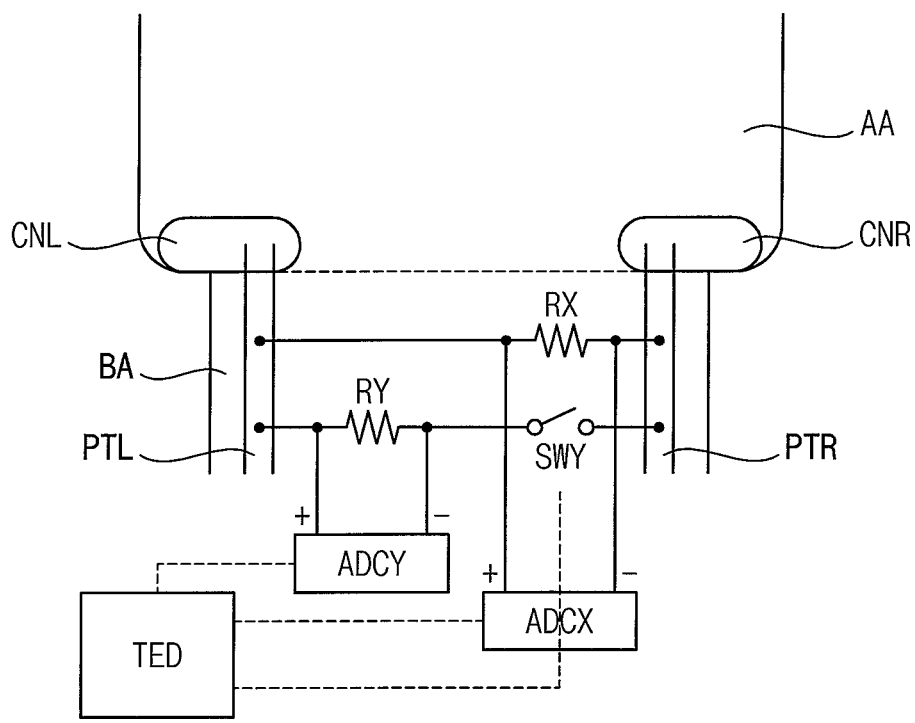
FIG. 6 is a conceptual diagram illustrating a portion of the display apparatus of FIG. 1.

FIG. 6 is a conceptual diagram illustrating a portion of the display apparatus of FIG. 1. FIG. 7 is a table illustrating a method of detecting a defect of the display apparatus of FIG. 1.

Referring to FIGS. 1-7, the defect of the display apparatus may include contact damage such as a contact hole defect in which a portion of the first contact hole CNL or a portion of the second contact hole CNR is opened (e.g., a disconnection occurs in the contact hole) and/or bending damage such as a wiring defect in which a portion of the first wiring PTL or a portion of the second wiring PTR is opened (e.g., a disconnection occurs in the wiring) due to a crack in the peripheral area BA.

To detect the defect of the display apparatus, the display apparatus may include a first resistor RX connected between the first wiring PTL and the second wiring PTR. The driving controller 200 or the timing controller embedded data driver TED may detect the defect of the display apparatus based on a first voltage ADCX at both ends of the first resistor RX. In other words, the first voltage ADCX is based on the voltage drop across the first resistor RX.

To detect the defect of the display apparatus in more detail (e.g., determine the position of the defect of the display apparatus), the display apparatus may further include a second resistor RY and a first switch SWY connected (e.g., connected in series) between the first wiring PTL and the second wiring PTR.

In one or more embodiments, a connection (connection point) between the first resistor RX and the first wiring PTL is closer to the first contact hole CNL than a connection between the second resistor RY and the first wiring PTL is to the first contact hole CNL. In one or more embodiments, a connection between the first resistor RX and the second wiring PTR is closer to the second contact hole CNR than a connection between the first switch SWY and the second wiring PTR is to the second contact hole CNR.

In the present example embodiment, the first resistor RX, the second resistor RY and the first switch SWY may be disposed in the peripheral area BA of the display panel 100.

The driving controller 200 or the timing controller embedded data driver TED may control a turn-on state and a turn-off state of the first switch SWY and may measure a first voltage ADCX at both ends of the first resistor RX and a second voltage ADCY at both ends of the second resistor RY (e.g., as shown in the embodiment of FIG. 6). In other words, the second voltage ADCY is based on the voltage drop across the second resistor RY.

The driving controller 200 or the timing controller embedded data driver TED may measure the first voltage ADCX and the second voltage ADCY when the first switch SWY is turned off. In addition, the driving controller 200 or the timing controller embedded data driver TED may measure the first voltage ADCX and the second voltage ADCY when the first switch SWY is turned on.

Figure 8:
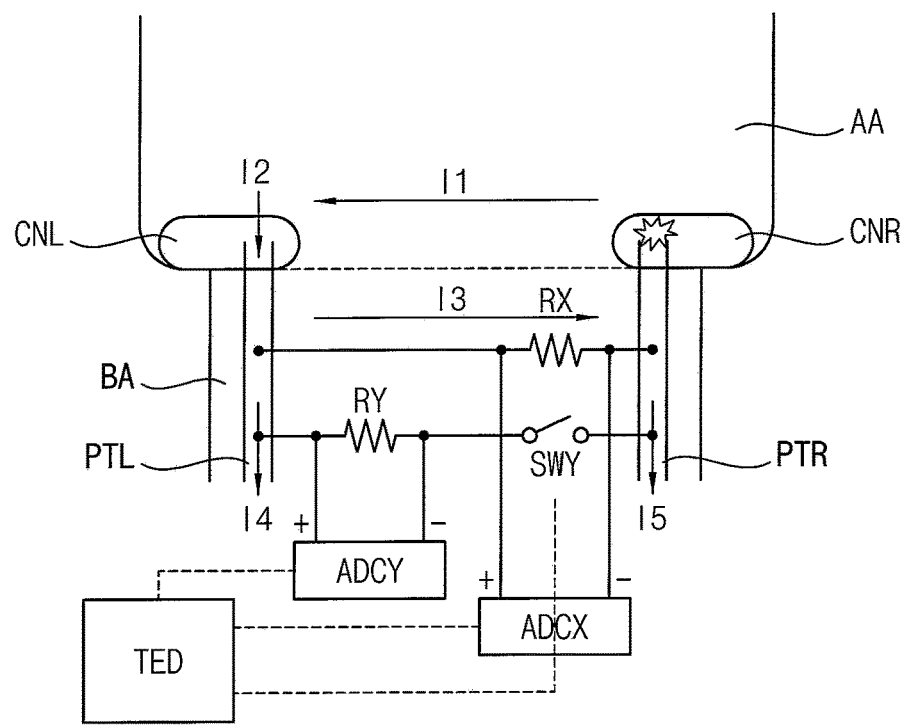
FIGS. 8 and 9 are conceptual diagrams illustrating a defect occurred at a second contact hole.
Figure 9:
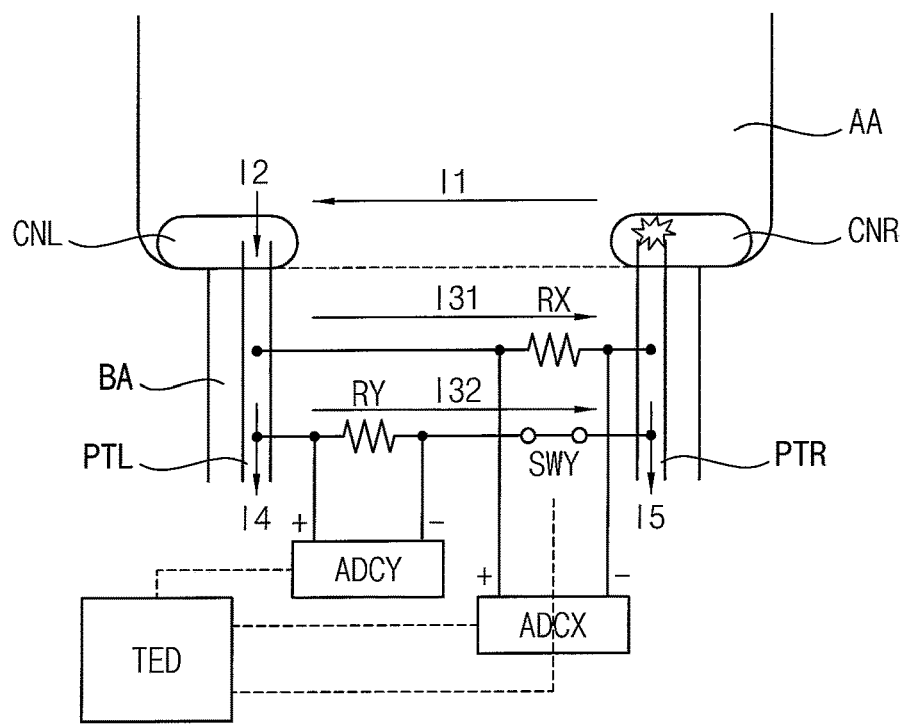

FIGS. 8 and 9 are conceptual diagrams illustrating a defect occurred at the second contact hole CNR.

Referring to FIGS. 6-9, when the defect occurs at the second contact hole CNR, a current does not flow from the second contact hole CNR to the second wiring PTR.

Therefore, a current I1 (e.g. current having an X value), flowing from the second contact hole CNR to the second wiring PTR in a normal status (e.g., during normal operation) without the defect, instead flows from the second contact hole CNR to the first contact hole CNL when the defect occurs at the second contact hole CNR.

Thus, a current I2 flowing from the first contact hole CNL to the first wiring PTL may have a higher level (e.g. current having a 2X value) when the defect occurs at the second contact hole CNR than a level of the current of the normal status (e.g., during normal operation) without the defect.

In FIG. 8, the first switch SWY is turned off so that the current does not flow through the second resistor RY (ADCY=0) and the current I2 (e.g. current having the 2X value) flowing from the first contact hole CNL to the first wiring PTL is divided into a current I3 (e.g. current having an X value) flowing toward the first resistor RX and a current I4 (e.g. current having an X value) flowing to the power voltage generator 700 through the first wiring PTL.

When a left electrode of the first voltage ADCX is a positive electrode and a right electrode of the first voltage ADCX is a negative electrode, a voltage generated by the current I3 (e.g. current having an X value) flowing toward the first resistor RX may be +ΔVdrop (i.e., a positive voltage drop).

The current I3 (e.g. current having an X value) flowing toward the first resistor RX may be a current I5 (e.g. current having an X value) flowing to the power voltage generator 700 through the second wiring PTR.

In FIG. 9, the first switch SWY is turned on so that the current I2 (e.g. current having a 2X value) flowing from the first contact hole CNL to the first wiring PTL is divided into a current I31 (e.g. current having a X/2 value) flowing to the first resistor RX, a current I32 (e.g. current having a X/2 value) flowing to the second resistor RY and a current I4 (e.g. current having an X value) flowing to the power voltage generator 700 through the first wiring PTL When the left electrode of the first voltage ADCX is the positive electrode and the right electrode of the first voltage ADCX is the negative electrode, a voltage generated by the current I31 (e.g. current having an X/2 value) flowing toward the first resistor RX may be +ΔVdrop/2. When a left electrode of the second voltage ADCY is a positive electrode and a right electrode of the second voltage ADCY is a negative electrode, a voltage generated by the current I32 (e.g. current having an X/2 value) flowing toward the second resistor RY may be +ΔVdrop/2.

In FIGS. 8 and 9, the second contact hole CNR is opened (e.g., a disconnection occurs in the second contact hole CNR). In contrast, when the first contact hole CNL is opened (e.g., a disconnection occurs in the first contact hole CNL), polarities of the first voltage ADCX and the second voltage ADCY are inverted from the case of FIGS. 8 and 9.

Thus, when the first contact hole CNL is opened (e.g., a disconnection occurs in the first contact hole CNL) and the first switch SWY is turned off, the first voltage ADCX at both ends of the first resistor RX may be −ΔVdrop (i.e., a negative voltage drop).

In addition, when the first contact hole CNL is opened (e.g., a disconnection occurs in the first contact hole CNL) and the first switch SWY is turned on, the first voltage ADCX at both ends of the first resistor RX may be −ΔVdrop/2 and the second voltage ADCY at both ends of the second resistor RY may be −ΔVdrop/2.

As explained above, in one or more embodiments, when an absolute value of the first voltage ADCX is ΔVdrop and an absolute value of the second voltage ADCY is zero in the turned-off state of the first switch SWY and the absolute value of the first voltage ADCX is ΔVdrop/2 and the absolute value of the second voltage ADCY is ΔVdrop/2 in the turned-on state of the first switch SWY, the driving controller 200 or the timing controller embedded data driver TED may detect the defect of the first contact hole CNL or the second contact hole CNR.

As explained above, in one or more embodiments, the defect of the first contact hole CNL and the defect of the second contact hole CNR may be detected using the first resistor RX, the second resistor RY and the first switch SWY. In other words, a defect may be detected based on the first resistor RX, the second resistor RY and/or the first switch SWY according to the first voltage ADCX and/or the second voltage ADCY.

Figure 10:
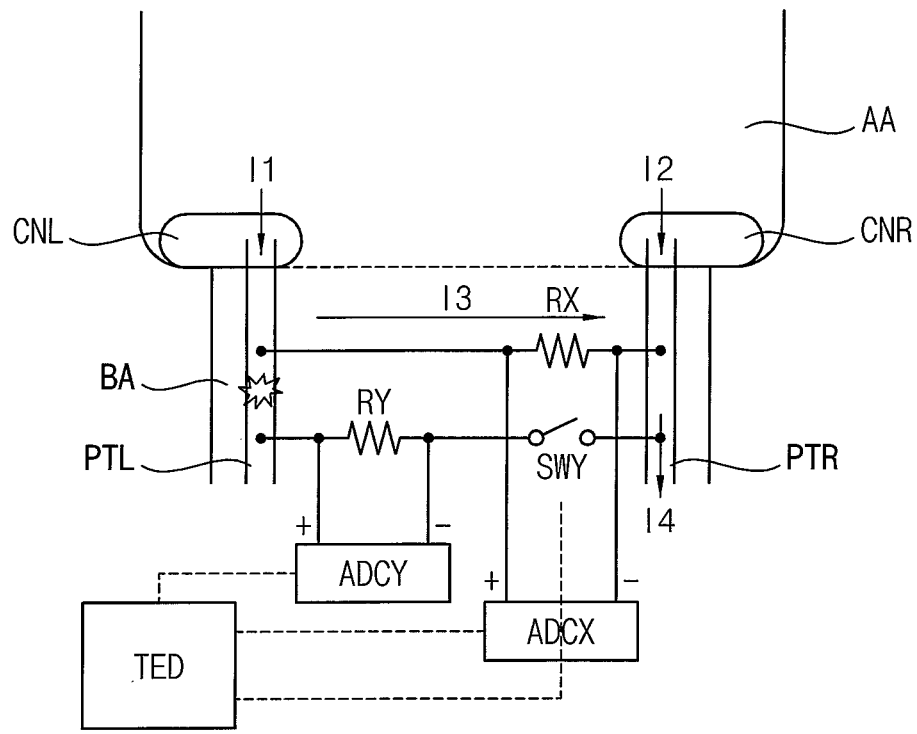
FIGS. 10 and 11 are conceptual diagrams illustrating a defect occurred at a first wiring.
Figure 11:
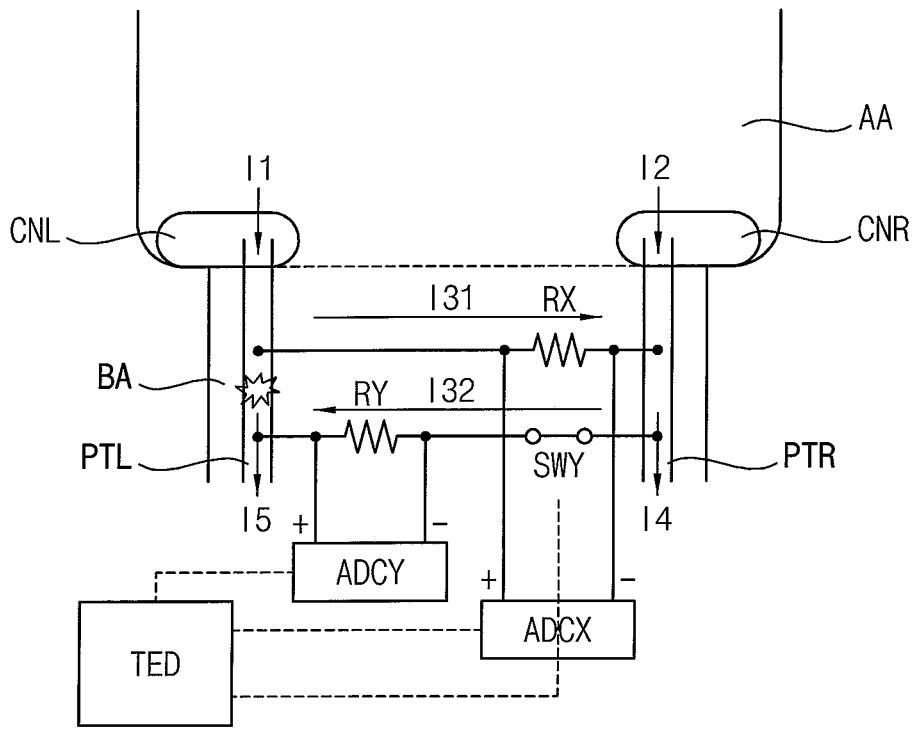

FIGS. 10 and 11 are conceptual diagrams illustrating a defect occurred at a first wiring PTL.

Referring to FIGS. 6, 7, 10 and 11, a first current I1 (e.g. current having an X value) flows from the first contact hole CNL to the first wiring PTL and a second current I2 (e.g. current having an X value) flows from the second contact hole CNR to the second wiring PTR.

In FIG. 10, a current I3 (e.g. current having an X value), flowing from the first contact hole CNL to the first wiring PTL in a normal status (e.g., during normal operation) without the defect, instead flows toward the first resistor RX when the defect occurs at the first wiring PTL.

In FIG. 10, when a left electrode of the first voltage ADCX is a positive electrode and a right electrode of the first voltage ADCX is a negative electrode, a voltage generated by the current I3 (e.g. current having an X value) flowing toward the first resistor RX may be +ΔVdrop.

In FIG. 10, the first switch SWY is turned off so that the current does not flow through the second resistor RY (ADCY=0) and the current I4 flowing through the second wiring PTR may have a higher level (e.g. a current have a 2X value) than a level of the current of the normal status (e.g., during normal operation) without the defect.

In FIG. 11, a current I31 (e.g. current having an X value), flowing from the first contact hole CNL to the first wiring PTL in a normal status (e.g., during normal operation) without the defect, instead flows toward the first resistor RX when the defect occurs at the first wiring PTL.

In FIG. 11, when the left electrode of the first voltage ADCX is the positive electrode and the right electrode of the first voltage ADCX is the negative electrode, a voltage generated by the current I31 (e.g. current having an X value) flowing toward the first resistor RX may be +ΔVdrop.

In FIG. 11, the first switch SWY is turned on so that the current flowing through the second wiring PTR is divided into a current I32 (e.g. current having an X value) flowing toward the second resistor RY and a current I4 (e.g. current having an X value) flowing toward the power voltage generator 700.

In addition, the current I32 (e.g. current having an X value) flowing toward the second resistor RY may be a current I5 (e.g. current having an X value) flowing to the power voltage generator 700 through the first wiring PTL.

In FIG. 10, when a left electrode of the second voltage ADCY is a positive electrode and a right electrode of the second voltage ADCY is a negative electrode, a voltage generated by the current I32 (e.g. current having an X value) flowing toward the second resistor RY may be −ΔVdrop. Herein, the current I32 (e.g. current having an X value) flowing toward the second resistor RY may have a level same as a level of the current I31 flowing toward the first resistor RX. The current I32 (e.g. current having an X value) flowing toward the second resistor RY may have a direction opposite to a direction of the current I31 flowing toward the first resistor RX.

In FIGS. 10 and 11, the first wiring PTL is opened (e.g., a disconnection occurs in the first wiring PTL). In contrast, when the second wiring PTR is opened (e.g., a disconnection occurs in the second wiring PTR), polarities of the first voltage ADCX and the second voltage ADCY are inverted from (relative to) the example embodiments of FIGS. 10 and 11 where the defect occurs at the first wiring PTL.

Thus, when the second wiring PTR is opened (e.g., a disconnection occurs in the second wiring PTR) and the first switch SWY is turned off, the first voltage ADCX at both ends of the first resistor RX may be −ΔVdrop.

In addition, when the second wiring PTR is opened (e.g., a disconnection occurs in the second wiring PTR) and the first switch SWY is turned on, the first voltage ADCX at both ends of the first resistor RX may be −ΔVdrop and the second voltage ADCY at both ends of the second resistor RY may be +ΔVdrop.

As explained above, in one or more embodiments, when an absolute value of the first voltage ADCX is ΔVdrop and an absolute value of the second voltage ADCY is zero in the turned-off state of the first switch SWY and the absolute value of the first voltage ADCX is ΔVdrop and the absolute value of the second voltage ADCY is ΔVdrop in the turned-on state of the first switch SWY, the driving controller 200 or the timing controller embedded data driver TED may detect the defect of the first wiring PTL or the second wiring PTR.

As explained above, in one or more embodiments, the defect of the first wiring PTL and the defect of the second wiring PTR may be detected using the first resistor RX, the second resistor RY and the first switch SWY. In other words, a defect may be detected based on the first resistor RX, the second resistor RY and/or the first switch SWY according to the first voltage ADCX and/or the second voltage ADCY.

In addition, referring again to FIGS. 6-11, the damage of the first contact hole CNL, the damage of the second contact hole CNR, the damage of the first wiring PTL and the damage of the second wiring PTR may be determined using the first resistor RX, the second resistor RY and the first switch SWY.

According to the present example embodiment, the position of the defect of the display apparatus may be determined (e.g., correctly determined) using the first resistor RX, the second resistor RY and the first switch SWY connected between the first wiring PTL and the second wiring PTR. Thus, the reliability of the display apparatus may be enhanced.

Figure 12:
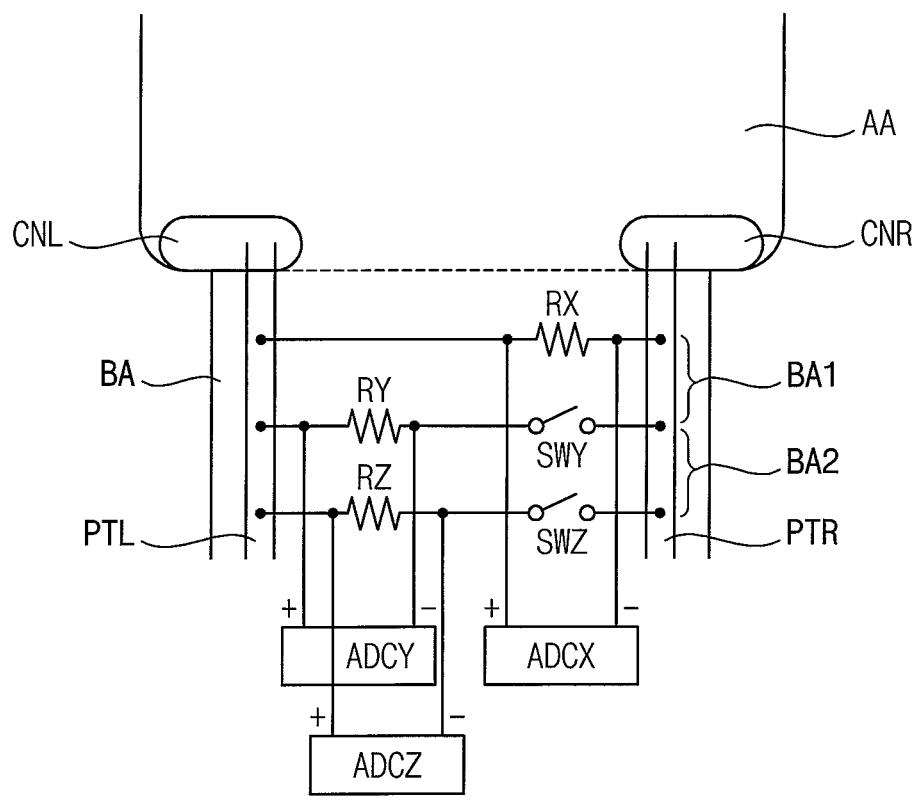
FIG. 12 is a conceptual diagram illustrating a portion of a display apparatus according to an example embodiment of the present disclosure.

FIG. 12 is a conceptual diagram illustrating a portion of a display apparatus according to an example embodiment of the present disclosure.

The display apparatus and the method of detecting the defect of the display apparatus according to the present example embodiment is substantially the same as the display apparatus and the method of detecting the defect of the display apparatus of the previous example embodiment explained referring to FIGS. 1-11 except that the display apparatus further includes a third resistor and a second switch. Thus, the same reference numerals will be used to refer to the same or like parts as those described in the previous exemplary embodiment of FIGS. 1-11 and any repetitive explanation concerning the above elements will be omitted.

Referring to FIGS. 1-5 and 12, the display apparatus includes a display panel 100 and a display panel driver. The display panel driver may include a driving controller 200, a gate driver 300, a gamma reference voltage generator 400, a data driver 500 and an emission driver 600. The display panel driver may further include a power voltage generator 700.

The display panel 100 may include an active area AA where an image is displayed and a peripheral area BA adjacent to the active area AA. The peripheral area BA may be a bending area (e.g., an area capable of bending) which is bent toward a rear surface of the display panel 100.

The display apparatus may further include a first wiring PTL disposed in the peripheral area BA and applying a second power voltage ELVSS to the second electrode and a second wiring PTR disposed in the peripheral area BA and applying the second power voltage ELVSS to the second electrode.

The display apparatus may further include a first contact hole CNL connecting the second electrode CAT and the first wiring PTL and a second contact hole CNR connecting the second electrode CAT and the second wiring PTR.

To detect the defect of the display apparatus, the display apparatus may include a first resistor RX connected between the first wiring PTL and the second wiring PTR. The driving controller 200 or the timing controller embedded data driver TED may detect the defect of the display apparatus based on a first voltage ADCX at both ends of the first resistor RX.

To detect the defect of the display apparatus in more detail (e.g., determine the position of the defect of the display apparatus), the display apparatus may further include a second resistor RY and a first switch SWY connected between the first wiring
PTL and the second wiring PTR.

In addition, to detect the defect of the display apparatus in more detail (e.g., determine the position of the defect of the display apparatus), the display apparatus may further include a third resistor RZ and a second switch SWZ connected between the first wiring PTL and the second wiring PTR.

In one or more embodiments, a connection between the first resistor RX and the first wiring PTL is closer to the first contact hole CNL than a connection between the second resistor RY and the first wiring PTL is to the first contact hole CNL, and a connection between the second resistor RY and the first wiring PTL is closer to the first contact hole CNL than a connection between the third resistor RZ and the first wiring PTL is to the first contact hole CNL. In one or more embodiments, a connection between the first resistor RX and the second wiring PTR is closer to the second contact hole CNR than a connection between the first switch SWY and the second wiring PTR is to the second contact hole CNR, and a connection between the first switch SWY and the second wiring PTR is closer to the second contact hole CNR than a connection between the second switch SWZ and the second wiring PTR is to the second contact hole CNR.

The driving controller 200 or the timing controller embedded data driver TED may control a turn-on state and a turn-off state of the first switch SWY and a turn-on state and a turn-off state of the second switch SWZ and may measure a first voltage ADCX at both ends of the first resistor RX, a second voltage ADCY at both ends of the second resistor RY and a third voltage ADCZ at both ends of the third resistor RZ.

For example, the driving controller 200 or the timing controller embedded data driver TED may measure the first voltage ADCX, the second voltage ADCY and the third voltage ADCZ when the first switch SWY is turned off and the second switch SWZ is turned off. In addition, the driving controller 200 or the timing controller embedded data driver TED may measure the first voltage ADCX, the second voltage ADCY and the third voltage ADCZ when at least one of the first switch SWY or the second switch SWZ is turned on.

According to the present example embodiment, the damage of the contact hole CNL and CNR, the damage of the first wiring PTL and second wiring PTR in an upper area BA1 of the peripheral area BA and the damage of the first wiring PTL and second wiring PTR in a lower area BA2 of the peripheral area BA may be determined. The method of detecting the display apparatus may be substantially the same as the method of detecting the display apparatus as explained referring to FIGS. 6-11.

According to the present example embodiment, the position of the defect of the display apparatus may be determined (e.g., correctly determined) using the first resistor RX, the second resistor RY, the third resistor RZ, the first switch SWY and the second switch SWZ connected between the first wiring PTL and the second wiring PTR. Thus, the reliability of the display apparatus may be enhanced.

Figure 13:
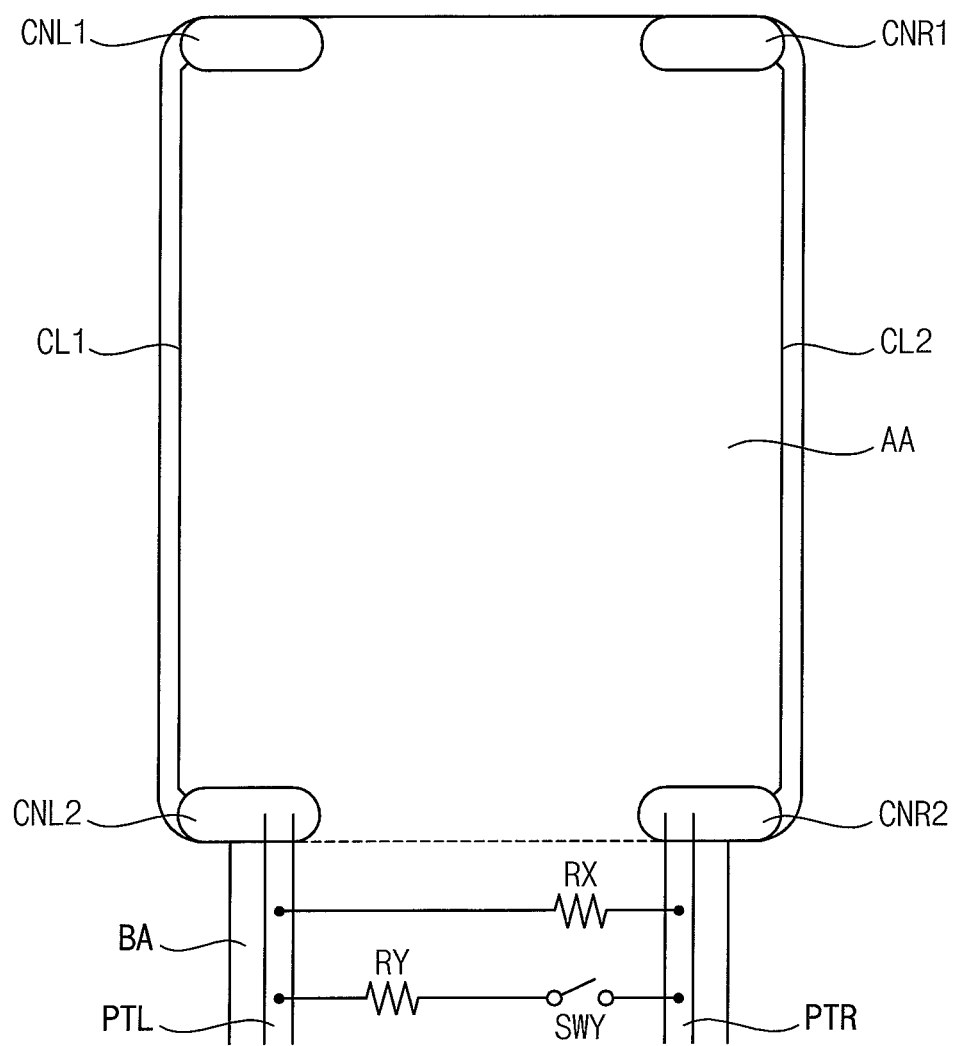
FIG. 13 is a conceptual diagram illustrating a portion of a display apparatus according to an example embodiment of the present disclosure.

FIG. 13 is a conceptual diagram illustrating a portion of a display apparatus according to an example embodiment of the present disclosure.

The display apparatus and the method of detecting the defect of the display apparatus according to the present example embodiment is substantially the same as the display apparatus and the method of detecting the defect of the display apparatus of the previous example embodiment explained with reference to FIGS. 1-11 except that the display apparatus further includes a third contact hole, a fourth contact hole, a third wiring and a fourth wiring. Thus, the same reference numerals will be used to refer to the same or like parts as those described in the previous exemplary embodiment of FIGS. 1-11 and any repetitive explanation concerning the above elements will be omitted.

Referring to FIGS. 1-11 and 13, the display apparatus includes a display panel 100 and a display panel driver. The display panel driver may include a driving controller 200, a gate driver 300, a gamma reference voltage generator 400, a data driver 500 and an emission driver 600. The display panel driver may further include a power voltage generator 700.

The display panel 100 may include an active area AA where an image is displayed and a peripheral area BA adjacent to the active area AA. The peripheral area BA may be a bending area (e.g., an area capable of bending) which is bent toward a rear surface of the display panel 100.

The display apparatus may further include a first wiring PTL disposed in the peripheral area BA and applying a second power voltage ELVSS to the second electrode and a second wiring PTR disposed in the peripheral area BA and applying the second power voltage ELVSS to the second electrode.

The display apparatus may further include a first contact hole CNL2 connecting the second electrode CAT and the first wiring PTL and a second contact hole CNR2 connecting the second electrode CAT and the second wiring PTR.

In the present example embodiment, the display apparatus may further include a third contact hole CNL1 connected to the second electrode CAT and a fourth contact hole CNR1 connected to the second electrode CAT. In addition, the display apparatus may further include a third wiring CL1 connected between the first contact hole CNL2 and the third contact hole CNL1 and a fourth wiring CL2 connected between the second contact hole CNR2 and the fourth contact hole CNR1. In other words, the third contact hole CNL1 may be a hole filled with a conductive element that connects the second electrode (e.g., cathode electrode) CAT and the third wiring CL1 and the fourth contact hole CNR1 may be a hole filled with a conductive element that connects the second electrode CAT and the fourth wiring CL2.

The first contact hole CNL2 and the second contact hole CNR2 may be connected to a first end portion of the second electrode CAT. The third contact hole CNL1 and the fourth contact hole CNR1 may be connected to a second end portion of the second electrode CAT opposite to the first end portion of the second electrode CAT. As shown in FIG. 13, the first end portion of the second electrode CAT may correspond to a lower portion of the active area AA of the display panel 100 and the second end portion of the second electrode CAT may correspond to an upper portion of the active area AA of the display panel 100. In other words, the second electrode CAT may be at a lower portion of the active area AA of the display panel 100 and the second end portion of the second electrode CAT may be at an upper portion of the active area AA of the display panel 100.

The third wiring CL1 may extend along a left side of the active area AA. The fourth wiring CL1 may extend along a right side of the active area AA.

In the present example embodiment, the method of detecting the display apparatus may be substantially the same as the method of detecting the display apparatus as explained referring to FIGS. 6-11.

In the present example embodiment (e.g., the embodiment of FIG. 13), the damage of the third wiring CL1 and the fourth wiring CL2 due to a crack of the active area AA of the display panel 100 may be detected as well as the damage of the first wiring PTL and the second wiring PTR due to the crack of the peripheral area BA of the display panel 100.

According to the present example embodiment, the position of the defect of the display apparatus may be determined (e.g., correctly determined) using the first resistor RX, the second resistor RY and the first switch SWY connected between the first wiring PTL and the second wiring PTR. Thus, the reliability of the display apparatus may be enhanced.

Figure 14:
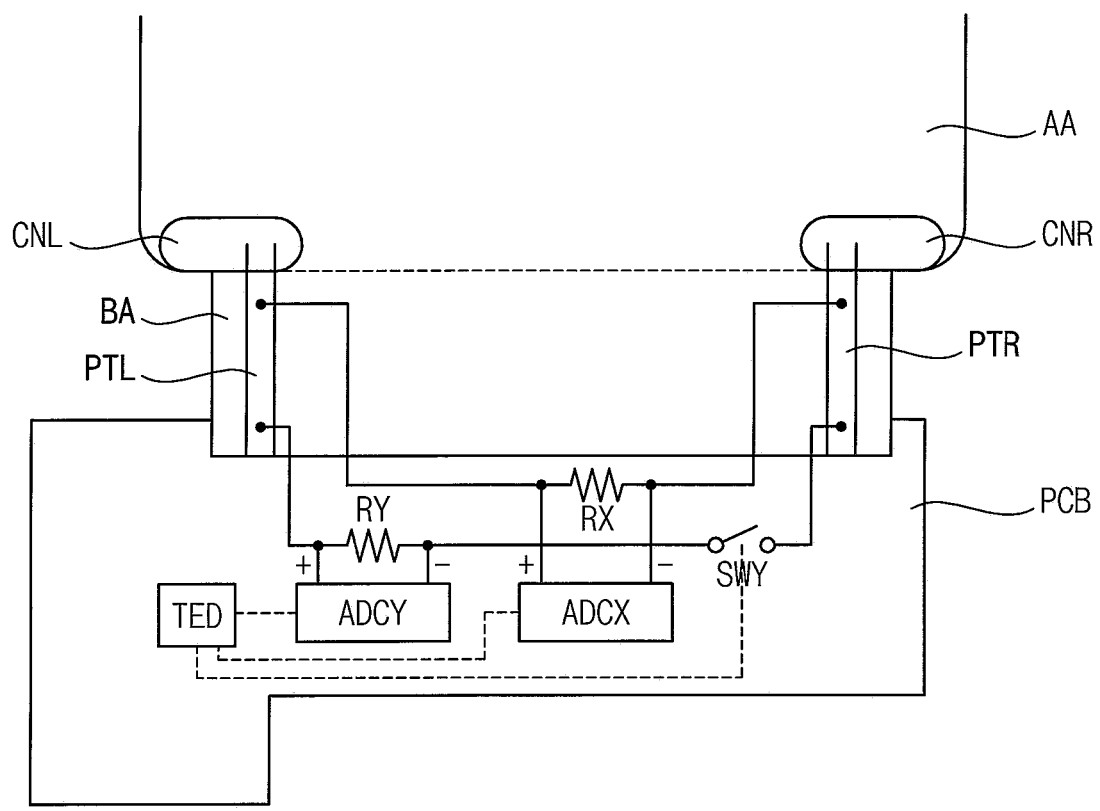
FIG. 14 is a conceptual diagram illustrating a portion of a display apparatus according to an example embodiment of the present disclosure.

FIG. 14 is a conceptual diagram illustrating a portion of a display apparatus according to an example embodiment of the present disclosure.

The display apparatus and the method of detecting the defect of the display apparatus according to the present example embodiment is substantially the same as the display apparatus and the method of detecting the defect of the display apparatus of the previous example embodiment explained referring to FIGS. 1-11 except that the first resistor, the second resistor and the first switch are disposed on the printed circuit board. Thus, the same reference numerals will be used to refer to the same or like parts as those described in the previous exemplary embodiment of FIGS. 1-11 and any repetitive explanation concerning the above elements will be omitted.

Referring to FIGS. 1-5 and 14, the display apparatus includes a display panel 100 and a display panel driver. The display panel driver may include a driving controller 200, a gate driver 300, a gamma reference voltage generator 400, a data driver 500 and an emission driver 600. The display panel driver may further include a power voltage generator 700.

The display panel 100 may include an active area AA where an image is displayed and a peripheral area BA adjacent to the active area AA. The peripheral area BA may be a bending area (e.g., an area capable of bending) which is bent toward a rear surface of the display panel 100.

The display apparatus may further include a printed circuit board PCB connected to the peripheral area BA. The driving controller 200, the gamma reference voltage generator 400, the data driver 500 and the power voltage generator 700 may be disposed on the printed circuit board PCB. The driving controller 200 and the data driver 500 may form the timing controller embedded data driver TED. For example, the timing controller embedded data driver TED may include the driving controller 200, the gamma reference voltage generator 400 and the data driver 500.

The display apparatus may further include a first wiring PTL disposed in the peripheral area BA and applying a second power voltage ELVSS to the second electrode and a second wiring PTR disposed in the peripheral area BA and applying the second power voltage ELVSS to the second electrode.

The display apparatus may further include a first contact hole CNL connecting the second electrode CAT and the first wiring PTL and a second contact hole CNR connecting the second electrode CAT and the second wiring PTR.

To detect the defect of the display apparatus, the display apparatus may include a first resistor RX connected between the first wiring PTL and the second wiring PTR. The driving controller 200 or the timing controller embedded data driver TED may detect the defect of the display apparatus based on a first voltage ADCX at both ends of the first resistor RX.

To detect the defect of the display apparatus more correctly, the display apparatus may further include a second resistor RY and a first switch SWY connected between the first wiring PTL and the second wiring PTR.

In the present example embodiment, the first resistor RX, the second resistor RY and the first switch SWY may be disposed on the printed circuit board PCB.

According to the present example embodiment, the position of the defect of the display apparatus may be determined (e.g., correctly determined) using the first resistor RX, the second resistor RY and the first switch SWY connected between the first wiring PTL and the second wiring PTR. Thus, the reliability of the display apparatus may be enhanced.

According to the present disclosure as explained above, in one or more embodiments, the position of the defect of the display apparatus may be determined (e.g., correctly determined) and the reliability of the display apparatus may be enhanced.

The terminology used herein is for the purpose of describing particular example embodiments only and is not intended to limit the example embodiments described herein.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, expressions such as "at least one of", "one of", and "selected from", when preceding a list of elements, modify the entire list of elements and do not modify the individual elements of the list.

As used herein, the term "and/or" includes any and all combinations of one or more of the associated listed items.

Further, the use of "may" when describing embodiments of the present disclosure refers to "one or more embodiments of the present disclosure".

It will be understood that when an element is referred to as being "on," "connected to," or "coupled to" another element, it may be directly on, connected, or coupled to the other element or one or more intervening elements may also be present. When an element is referred to as being "directly on," "directly connected to," or "directly coupled to" another element, there are no intervening elements present.

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially", "about", and similar terms are used as terms of approximation and not as terms of degree, and are intended to account for the inherent deviations in measured or calculated values that would be recognized by those of ordinary skill in the art.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The foregoing is illustrative of the present disclosure and is not to be construed as limiting thereof. Although a few example embodiments of the present disclosure have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of the present disclosure and is not to be construed as limited to the specific example embodiments disclosed, and that modifications to the disclosed example embodiments, as well as other example embodiments, are intended to be included within the scope of the appended claims, and equivalents thereof. The present disclosure is defined by the following claims, with equivalents of the claims to be included therein.

What is claimed is:

1. A display apparatus comprising:
   a display panel comprising an active area to display an image and a peripheral area adjacent to the active area;
   an electrode in the active area;
   a first wiring in the peripheral area and configured to apply a power voltage to the electrode;
   a second wiring in the peripheral area and configured to apply the power voltage to the electrode;
   a first contact hole connecting the electrode and the first wiring;
   a second contact hole connecting the electrode and the second wiring; and
   a first resistor connected between the first wiring and the second wiring.

2. The display apparatus of claim 1, further comprising a second resistor and a first switch connected between the first wiring and the second wiring.

3. The display apparatus of claim 2, further comprising a driving controller configured to measure a first voltage at both ends of the first resistor and a second voltage at both ends of the second resistor in response to a turned-off state of the first switch, and to measure the first voltage and the second voltage in response to a turned-on state of the first switch.

4. The display apparatus of claim 3, wherein the driving controller is configured to detect a defect of the first contact hole or the second contact hole based on an absolute value of the first voltage being ΔVdrop and an absolute value of the second voltage being zero in response to the turned-off state of the first switch, and based on the absolute value of the first voltage being ΔVdrop/2 and the absolute value of the second voltage being ΔVdrop/2 in response to the turned-on state of the first switch.

5. The display apparatus of claim 4, wherein the driving controller is configured to detect a defect of the first wiring or the second wiring based on the absolute value of the first voltage being ΔVdrop and the absolute value of the second voltage being zero in response to the turned-off state of the first switch, and based on the absolute value of the first voltage being ΔVdrop and the absolute value of the second voltage being ΔVdrop in response to the turned-on state of the first switch.

6. The display apparatus of claim 2, further comprising a third resistor and a second switch connected between the first wiring and the second wiring.

7. The display apparatus of claim 6, wherein a driving controller is configured to measure a first voltage at both ends of the first resistor, a second voltage at both ends of the second resistor, and a third voltage at both ends of the third resistor in response to a turned-off state of the first switch and a turned-off state of the second switch, and to measure the first voltage, the second voltage, and the third voltage in response to a turned-on state of at least one of the first switch or the second switch.

8. The display apparatus of claim 2, further comprising:
a third contact hole connected to the electrode;
a fourth contact hole connected to the electrode;
a third wiring connecting the first contact hole and the third contact hole; and
a fourth wiring connecting the second contact hole and the fourth contact hole.

9. The display apparatus of claim 8, wherein the first contact hole and the second contact hole are connected to a first end portion of the electrode, and
wherein the third contact hole and the fourth contact hole are connected to a second end portion of the electrode opposite to the first end portion of the electrode.

10. The display apparatus of claim 2, wherein the first resistor, the second resistor, and the first switch are in the peripheral area of the display panel.

11. The display apparatus of claim 2, further comprising a printed circuit board connected to the peripheral area of the display panel,
wherein the first resistor, the second resistor, and the first switch are on the printed circuit board.

12. The display apparatus of claim 1, wherein the display panel comprises a plurality of pixels,
wherein the pixels comprise organic light emitting elements,
wherein the electrode is a cathode electrode of the organic light emitting elements.

13. The display apparatus of claim 12, wherein a first power voltage and a second power voltage less than the first power voltage are applied to a pixel of the plurality of pixels, and
wherein the second power voltage is applied to the first wiring and the second wiring.

14. A method of detecting a defect of a display apparatus, the method comprising:
applying a power voltage to a first wiring, a first contact hole connected to the first wiring, and an electrode connected to the first contact hole;
applying the power voltage to a second wiring, a second contact hole connected to the second wiring, and the electrode connected to the second contact hole; and
measuring a first voltage at both ends of a first resistor connected between the first wiring and the second wiring,
wherein the electrode is in an active area,
wherein the first wiring and the second wiring are in a peripheral area adjacent to the active area.

15. The method of claim 14, further comprising:
controlling a first switch connected between the first wiring and the second wiring; and
measuring a second voltage at both ends of a second resistor connected between the first wiring and the second wiring and connected to the first switch.

16. The method of claim 15, wherein the measuring the second voltage comprises:
measuring the first voltage and the second voltage in response to a turned-off state of the first switch; and
measuring the first voltage and the second voltage in response to a turned-on state of the first switch.

17. The method of claim 16, further comprising detecting a defect of the first contact hole or the second contact hole when an absolute value of the first voltage is ΔVdrop and an absolute value of the second voltage is zero in response to the turned-off state of the first switch, and the absolute value of the first voltage is ΔVdrop/2 and the absolute value of the second voltage is ΔVdrop/2 in response to the turned-on state of the first switch.

18. The method of claim 17, further comprising detecting a defect of the first wiring or the second wiring when the absolute value of the first voltage is ΔVdrop and the absolute value of the second voltage is zero in response to the turned-off state of the first switch, and the absolute value of the first voltage is ΔVdrop and the absolute value of the second voltage is ΔVdrop in response to the turned-on state of the first switch.

19. The method of claim 15, further comprising:
controlling a second switch connected between the first wiring and the second wiring; and
measuring a third voltage at both ends of a third resistor connected between the first wiring and the second wiring and connected to the second switch.

20. The method of claim 19, wherein the measuring the third voltage comprises:
measuring the first voltage, the second voltage, and the third voltage in response to a turned-off state of the first switch and a turned-off state of the second switch; and
measuring the first voltage, the second voltage, and the third voltage in response to a turned-on state of at least one of the first switch or the second switch.

* * * * *